(12) United States Patent
Seo

(10) Patent No.: US 11,875,863 B2
(45) Date of Patent: Jan. 16, 2024

(54) MEMORY DEVICE CONFIGURED TO APPLY FIRST AND SECOND PASS VOLTAGES TO UNSELECTED WORD LINES BASED ON AN OPERATING VOLTAGE

(71) Applicant: SK hynix Inc., Icheon-si (KR)

(72) Inventor: Moon Sik Seo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/517,015

(22) Filed: Nov. 2, 2021

(65) Prior Publication Data

US 2022/0375534 A1 Nov. 24, 2022

(30) Foreign Application Priority Data

May 18, 2021 (KR) ........................ 10-2021-0064408

(51) Int. Cl.
G11C 16/34 (2006.01)
G11C 16/10 (2006.01)
G11C 16/30 (2006.01)
G11C 16/08 (2006.01)
G11C 16/28 (2006.01)

(52) U.S. Cl.
CPC .......... *G11C 16/3459* (2013.01); *G11C 16/08* (2013.01); *G11C 16/102* (2013.01); *G11C 16/28* (2013.01); *G11C 16/30* (2013.01)

(58) Field of Classification Search
None
See application file for complete search history.

(56) References Cited

U.S. PATENT DOCUMENTS 8,441,856 B2 * 5/2013 Kim ...................... G11C 16/10
365/185.23

FOREIGN PATENT DOCUMENTS

KR 101784973 B1 10/2017

* cited by examiner

*Primary Examiner* — Kretelia Graham
(74) *Attorney, Agent, or Firm* — William Park & Associates Ltd.

(57) ABSTRACT

Provided herein may be a memory device and a method of operating the same. The memory device may include a plurality of memory cells, a peripheral circuit, and a control logic. The memory cells may be coupled to a plurality of word lines. The peripheral circuit may perform a memory operation on selected memory cells. The control logic may control the peripheral circuit, during the memory operation, to apply an operating voltage to a selected word line, among the plurality of word lines, coupled to the selected memory cells, a first pass voltage to target word lines adjacent to the selected word line among unselected word lines, based on whether the operating voltage is lower than or equal to a reference voltage, and a second pass voltage, having a lower level than the first pass voltage, to remaining unselected word lines, other than the target word lines.

17 Claims, 15 Drawing Sheets

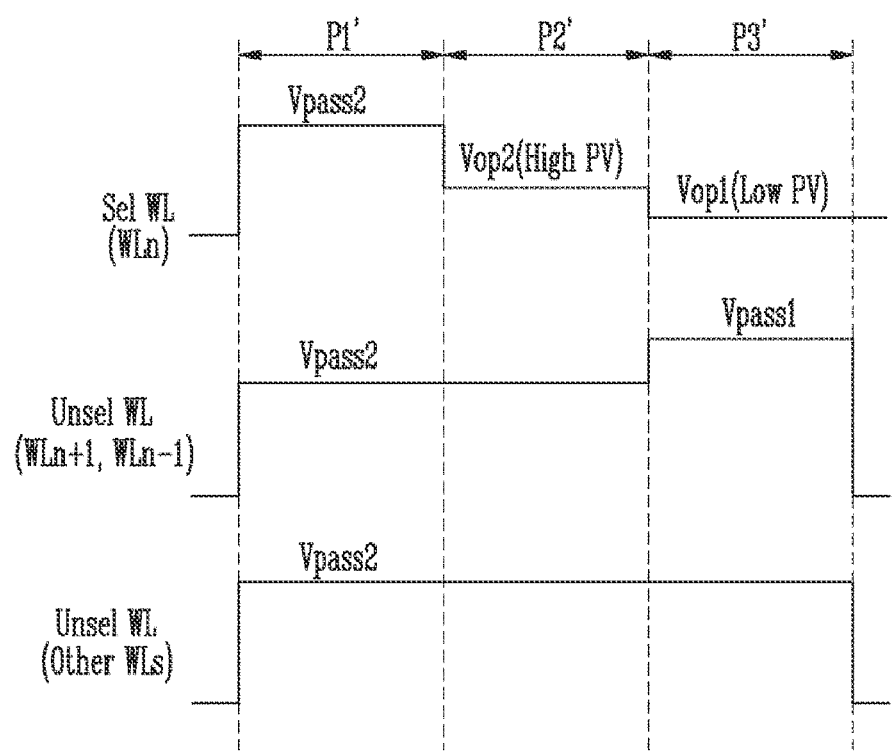

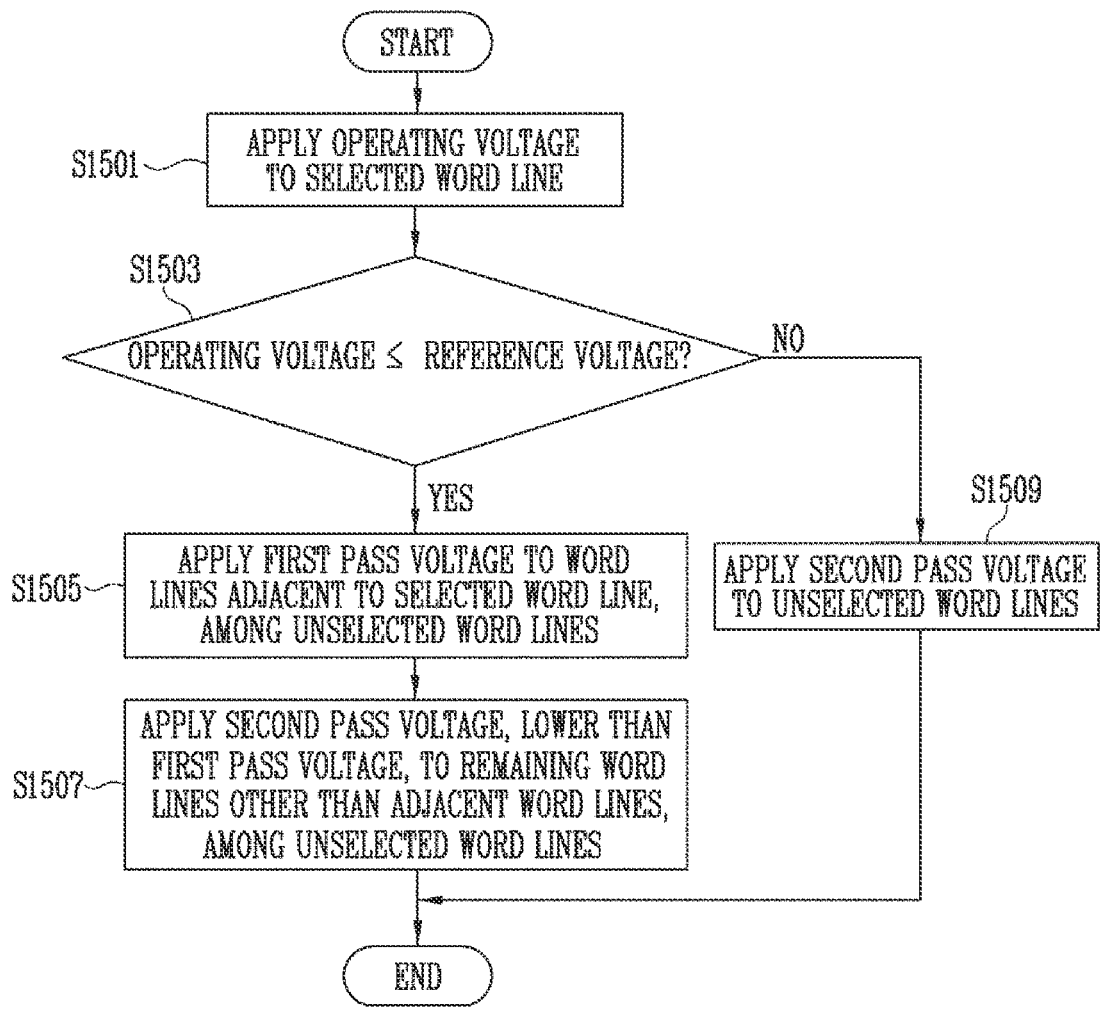

MEMORY DEVICE CONFIGURED TO APPLY FIRST AND SECOND PASS VOLTAGES TO UNSELECTED WORD LINES BASED ON AN OPERATING VOLTAGE

CROSS-REFERENCE TO RELATED APPLICATION

The present application claims priority under 35 U.S.C. § 119(a) to Korean patent application number 10-2021-0064408, filed on May 18, 2021, in the Korean Intellectual Property Office, the entire disclosure of which is incorporated herein by reference.

BACKGROUND

1. Technical Field

Various embodiments of the present disclosure generally relate to an electronic device, and more particularly to a memory device and a method of operating the memory device.

2. Related Art

A storage device is a device that stores data based on a host device, such as a computer or a smartphone. The storage device may include a memory device in which data is stored and a memory controller that controls the memory device. Such memory devices are classified as a volatile memory device and a nonvolatile memory device.

The volatile memory device is a memory device in which data is stored only when power is supplied and in which stored data is lost when the supply of power is interrupted. Examples of the volatile memory device include a static random access memory (SRAM) and a dynamic random access memory (DRAM).

The nonvolatile memory device is a memory device in which stored data is retained even when the supply of power is interrupted. Examples of the nonvolatile memory device include a read only memory (ROM), a programmable ROM (PROM), an electrically programmable ROM (EPROM), an electrically erasable and programmable ROM (EEPROM), and a flash memory.

SUMMARY

An embodiment of the present disclosure may provide for a memory device. The memory device may include a plurality of memory cells, a peripheral circuit, and a control logic. The plurality of memory cells may be coupled to a plurality of word lines. The peripheral circuit may perform a memory operation on memory cells that are selected from among the plurality of memory cells. The control logic may control the peripheral circuit, during the memory operation, to apply an operating voltage to a selected word line, among the plurality of word lines, coupled to the selected memory cells, a first pass voltage to target word lines adjacent to the selected word line among unselected word lines, based on whether the operating voltage is lower than or equal to a reference voltage, and a second pass voltage, having a lower level than the first pass voltage, to remaining unselected word lines, other than the target word lines.

An embodiment of the present disclosure may provide for a method of operating a memory device, the memory device with a plurality of memory cells that are coupled to a plurality of word lines. The method may include applying an operating voltage to a selected word line coupled to memory cells that are selected from among the plurality of memory cells, determining whether the operating voltage is lower than or equal to a reference voltage, and when the operating voltage is lower than or equal to the reference voltage, applying a first pass voltage to target word lines adjacent to the selected word line among unselected word lines, and a second pass voltage, having a lower level than the first pass voltage, to remaining unselected word lines, other than the target word lines, among the unselected word lines.

BRIEF DESCRIPTION OF THE DRAWINGS

FIG. 13B is a timing diagram illustrating the operation of a memory device according to an embodiment.

FIG. 15 is a flowchart illustrating the operation of a memory device according to an embodiment.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Various embodiments of the present disclosure are directed to a memory device in which a read margin between threshold voltage distributions that correspond to respective program states is improved, and a method of operating the memory device.

Figure 1:
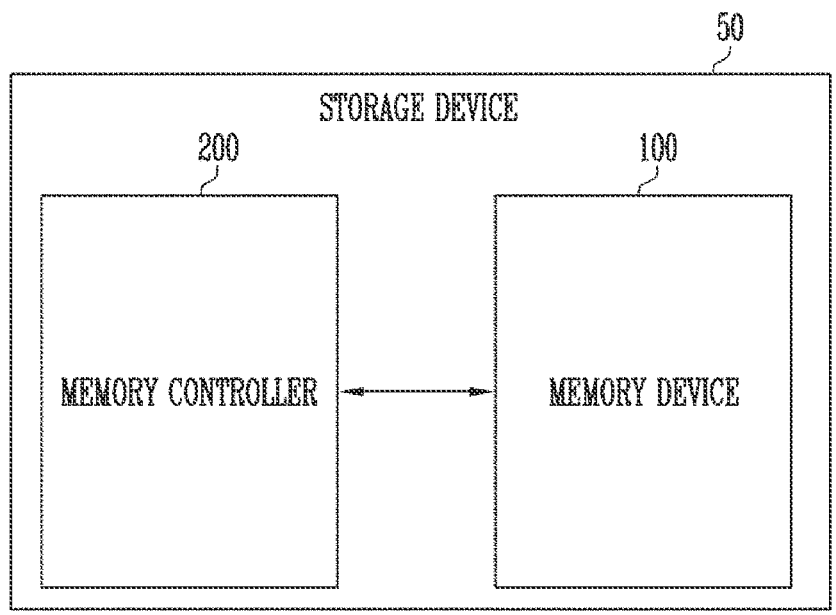
FIG. 1 is a diagram illustrating a storage device according to an embodiment of the present disclosure.

FIG. 1 is a diagram illustrating a storage device according to an embodiment of the present disclosure.

Referring to FIG. 1, a storage device 50 may include a memory device 100 and a memory controller 200 which controls the operation of the memory device 100. The storage device 50 may be a device which stores data based on a host, such as a mobile phone, a smartphone, an MP3 player, a laptop computer, a desktop computer, a game console, a television (TV), a tablet PC, or an in-vehicle infotainment system.

The storage device 50 may be manufactured as any one of various types of storage devices based on a host interface that is a scheme for communication with the host. The storage device 50 may be implemented as any one of various types of storage devices, for example, a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 may be operated in response to the control of the memory controller 200. The memory device 100 may include a memory cell array including a plurality of memory cells which store data.

Each of the memory cells may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. A single memory block may include a plurality of pages. In an embodiment, each page may be a unit by which data is stored in the memory device 100 or by which data that is stored in the memory device 100 is read.

A memory block may be a unit by which data is erased. In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change RAM (PRAM), a magnetoresistive RAM (MRAM), a ferroelectric RAM (FRAM), or a spin transfer torque RAM (STT-RAM). In the present specification, for convenience of description, a description will be made on the assumption that the memory device 100 is a NAND flash memory.

The memory device 100 may receive a command and an address from the memory controller 200, and the memory device 100 may access the area of the memory cell array that is selected by the address. That is, the memory device 100 may perform an operation that is indicated by the command on the area that is selected by the address. For example, the memory device 100 may perform a write operation (i.e., program operation), a read operation, and an erase operation. During a program operation, the memory device 100 may program data to the area that is selected by the address. During a read operation, the memory device 100 may read data from the area that is selected by the address. During an erase operation, the memory device 100 may erase data that is stored in the area that is selected by the address.

The memory controller 200 may control the overall operation of the storage device 50.

When power is applied to the storage device 50, the memory controller 200 may run firmware (FW). When the memory device 100 is a flash memory device, the memory controller 200 may run firmware, such as a flash translation layer (FTL) for controlling the communication between the host and the memory device 100.

In an embodiment, the memory controller 200 may receive data and a logical block address (LBA) from the host, and the memory controller 200 may translate the logical block address (LBA) into a physical block address (PBA) that indicates the address of memory cells that are included in the memory device 100 and in which data is to be stored.

The memory controller 200 may control the memory device 100 so that a program operation, a read operation, or an erase operation is performed in response to a request received from the host. During a program operation, the memory controller 200 may provide a write command, a physical block address (PBA), and data to the memory device 100. During a read operation, the memory controller 200 may provide a read command and a physical block address (PBA) to the memory device 100. During an erase operation, the memory controller 200 may provide an erase command and a physical block address (PBA) to the memory device 100.

In an embodiment, the memory controller 200 may autonomously generate a command, an address, and data regardless of whether a request from the host is received, and the memory controller 200 may transmit them to the memory device 100. For example, the memory controller 200 may provide commands, addresses, and data to the memory device 100 so as to perform background operations, such as a program operation for wear leveling and a program operation for garbage collection.

In an embodiment, the memory controller 200 may control at least two memory devices 100. In this case, the memory controller 200 may control the memory devices 100 by using an interleaving scheme to improve operating performance. The interleaving scheme may be an operating manner in which the operating periods of at least two memory devices 100 are caused to overlap each other.

The host may communicate with the storage device 50 by using at least one of various communication methods such as USB, Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
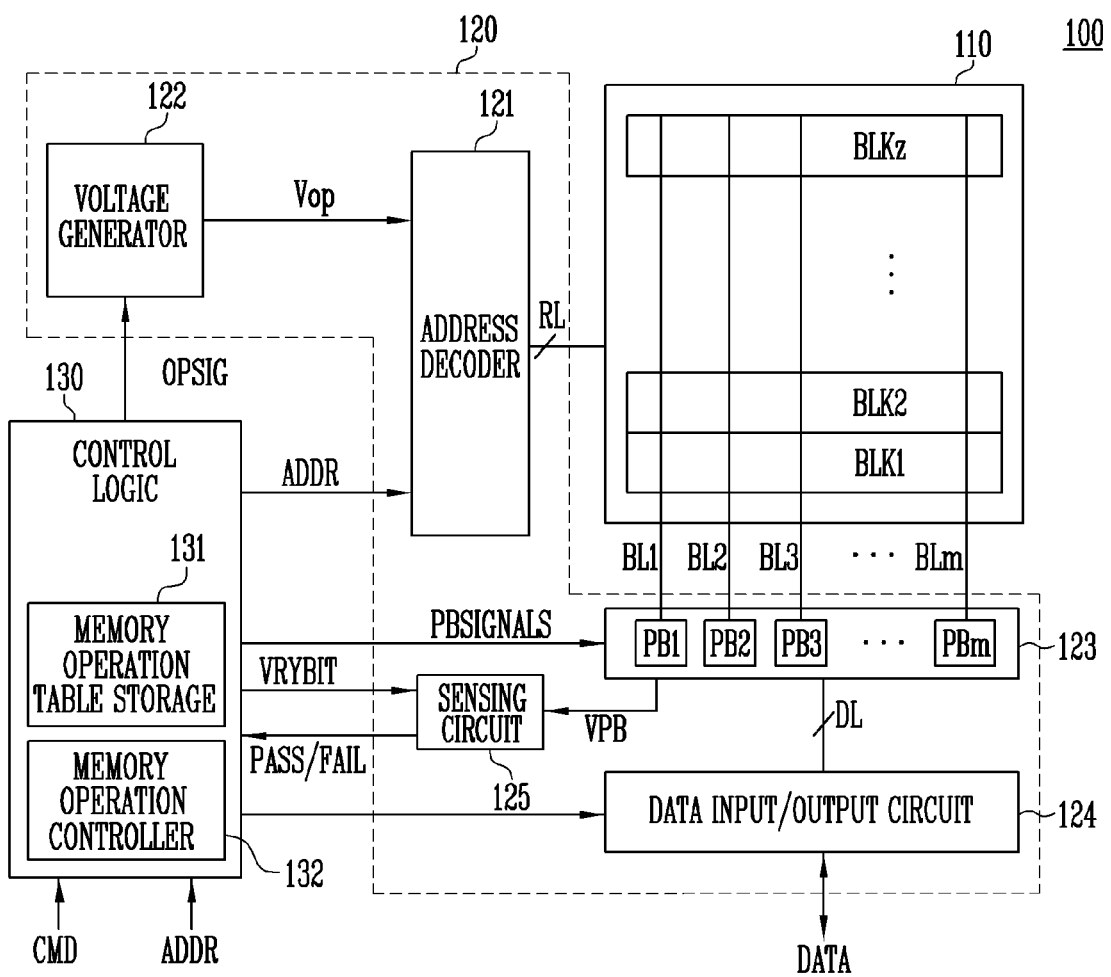
FIG. 2 is a diagram illustrating the structure of a memory device of FIG. 1.

FIG. 2 is a diagram illustrating the structure of the memory device of FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be coupled to an address decoder 121 through row lines RL. The memory blocks BLK1 to BLKz may be coupled to a read and write circuit 123 through bit lines BL1 to BLm. Each of the memory blocks BLK1 to BLKz may include a plurality of memory cells. In an embodiment, the plurality of memory cells may be nonvolatile memory cells. In the plurality of memory cells, memory cells that are coupled to the same word line may be defined as a single physical page. That is, the memory cell array 110 may be composed of a plurality of physical pages. In accordance with an embodiment of the present disclosure, each of the plurality of memory blocks BLK1 to BLKz that is included in the memory cell array 110 may include a plurality of dummy cells. As the dummy cells, one or more dummy cells may be coupled in series between a drain select transistor and the memory cells and between a source select transistor and the memory cells.

Each of the memory cells of the memory device 100 may be implemented as a single-level cell (SLC) that is capable of storing a single data bit, a multi-level cell (MLC) that is capable of storing two data bits, a triple-level cell (TLC) that is capable of storing three data bits, or a quad-level cell (QLC) that is capable of storing four data bits.

The peripheral circuit 120 may include the address decoder 121, a voltage generator 122, the read and write circuit 123, a data input/output circuit 124, and a sensing circuit 125.

The peripheral circuit 120 may drive the memory cell array 110. For example, the peripheral circuit 120 may drive the memory cell array 110 so that a program operation, a read operation, and an erase operation are performed.

The address decoder 121 may be coupled to the memory cell array 110 through row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may operate based on the control logic 130. The address decoder 121 may receive addresses ADDR from the control logic 130.

The address decoder 121 may decode a block address, among the received addresses ADDR. The address decoder 121 may select at least one of the memory blocks BLK1 to BLKz according to the decoded block address. The address decoder 121 may decode a row address among the received addresses ADDR. The address decoder 121 may select at least one of word lines of the selected memory block according to the decoded row address. The address decoder 121 may apply operating voltages Vop that are supplied from the voltage generator 122 to the selected word line.

During a program operation, the address decoder 121 may apply a program voltage to the selected word line and apply a program pass voltage, having a lower level than the program voltage, to unselected word lines. During a program verify operation, the address decoder 121 may apply a verify voltage to a selected word line and apply a verify pass voltage with a higher level than the verify voltage to unselected word lines.

During a read operation, the address decoder 121 may apply a read voltage to a selected word line and apply a read pass voltage with a higher level than the read voltage to unselected word lines.

In accordance with an embodiment of the present disclosure, the erase operation of the memory device 100 may be performed on a memory block basis. During an erase operation, the addresses ADDR that is input to the memory device 100 may include a block address. The address decoder 121 may decode the block address and select a single memory block in response to the decoded block address. During the erase operation, the address decoder 121 may apply a ground voltage to word lines that are coupled to the selected memory block.

In accordance with an embodiment of the present disclosure, the address decoder 121 may decode a column address, among the received addresses ADDR. The decoded column address may be transferred to the read and write circuit 123. In an embodiment, the address decoder 121 may include components, such as a row decoder, a column decoder, and an address buffer.

The voltage generator 122 may generate a plurality of operating voltages Vop by using an external supply voltage that is supplied to the memory device 100. The voltage generator 122 may be operated based on the control logic 130.

In an embodiment, the voltage generator 122 may generate an internal supply voltage by regulating the external supply voltage. The internal supply voltage that is generated by the voltage generator 122 is used as an operating voltage for the memory device 100.

In an embodiment, the voltage generator 122 may generate the plurality of operating voltages Vop by using the external supply voltage or the internal supply voltage. The voltage generator 122 may generate various voltages that are required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage so as to generate a plurality of operating voltages Vop with various voltage levels, and the voltage generator 122 may generate the plurality of operating voltages Vop by selectively enabling the plurality of pumping capacitors based on the control logic 130.

The generated operating voltages Vop may be supplied to the memory cell array 110 by the address decoder 121.

The read and write circuit 123 may include first to m-th page buffers PB1 to PBm. The first to m-th page buffers PB1 to PBm may be coupled to the memory cell array 110 through the first to m-th bit lines BL1 to BLm, respectively. The first to m-th page buffers PB1 to PBm may be operated based on the control logic 130.

The first to m-th page buffers PB1 to PBm may perform data communication with the data input/output circuit 124. During a program operation, the first to m-th page buffers PB1 to PBm may receive data DATA to be stored through the data input/output circuit 124 and data lines DL.

During a program operation, the first to m-th page buffers PB1 to PBm may transfer the data DATA to be stored, received through the data input/output circuit 124, to selected memory cells through the bit lines BL1 to BLm when a program voltage is applied to a selected word line. Memory cells in a selected page may be programmed based on the received data DATA. Memory cells that are coupled to a bit line to which a program-permission voltage (e.g., a ground voltage) is applied may have increased threshold voltages. The threshold voltages of memory cells that are coupled to a bit line to which a program-inhibition voltage (e.g., a supply voltage) is applied may be maintained. During a program verify operation, the first to m-th page buffers PB1 to PBm read the data DATA that is stored in the selected memory cells from the selected memory cells through the bit lines BL1 to BLm.

During a read operation, the read and write circuit 123 may read data DATA from the memory cells in the selected page through the bit lines BL, and the read and write circuit 123 may store the read data DATA in the first to m-th page buffers PB1 to PBm.

During an erase operation, the read and write circuit 123 may allow the bit lines BL to float. In an embodiment, the read and write circuit 123 may include a column select circuit.

The data input/output circuit 124 may be coupled to the first to m-th page buffers PB1 to PBm through the data lines DL. The data input/output circuit 124 may be operated in response to the control of the control logic 130.

The data input/output circuit 124 may include a plurality of input/output buffers (not illustrated) that receive input data DATA. During a program operation, the data input/output circuit 124 may receive the data DATA to be stored from an external controller (not illustrated). During a read operation, the data input/output circuit 124 may output the data DATA, received from the first to m-th page buffers PB1 to PBm that are included in the read and write circuit 123, to the external controller.

During a read operation or a verify operation, the sensing circuit 125 may generate a reference current in response to an enable bit signal VRYBIT that is generated by the control logic 130, and the sensing circuit 125 may output a pass signal or a fail signal to the control logic 130 by comparing a sensing voltage VPB that is received from the read and write circuit 123 with a reference voltage that is generated by the reference current.

The control logic 130 may be coupled to the address decoder 121, the voltage generator 122, the read and write circuit 123, the data input/output circuit 124, and the sensing circuit 125. The control logic 130 may control the overall operation of the memory device 100. The control logic 130 may be operated in response to a command CMD transmitted from an external device.

The control logic 130 may control the peripheral circuit 120 by generating various types of signals in response to the command CMD and the addresses ADDR. For example, the control logic 130 may generate an operation signal OPSIG, an address ADDR, read and write circuit control signals PBSIGNALS, and an enable bit VRYBIT in response to the command CMD and the addresses ADDR. The control logic 130 may output the operation signal OPSIG to the voltage generator 122, output the address ADDR to the address decoder 121, output the read and write circuit control signals PBSIGNALS to the read and write circuit 123, and output the enable bit VRYBIT to the sensing circuit 125. In addition, the control logic 130 may determine whether a verify operation has passed or failed in response to the pass or fail signal PASS or FAIL that is output from the sensing circuit 125.

In an embodiment, the peripheral circuit 120 may perform a memory operation on memory cells that are selected from among the plurality of memory cells. The memory operation may be a read operation or a program verify operation.

The control logic 130 may control the peripheral circuit 120 so that an operating voltage is applied to a selected word line that is coupled to the selected memory cells, among a plurality of word lines, during a memory operation. The control logic 130 may control the peripheral circuit 120 so that a first pass voltage is applied to unselected word lines that are adjacent to the selected word line, referred to as target word lines, based on whether the operating voltage is lower than or equal to a reference voltage. The control logic 130 may control the peripheral circuit 120 so that a second pass voltage, which has a lower level than the first pass voltage, is applied to the remaining unselected word lines, other than the target word lines, among the unselected word lines.

In an embodiment, the control logic 130 may include a memory operation table storage 131 and a memory operation controller 132.

The memory operation table storage 131 may store information regarding the operating voltage that is used in the memory operation and information regarding a plurality of pass voltages. The operating voltage may be a read voltage or a program verify voltage that is applied to the selected word line. The plurality of pass voltages may be applied to unselected word lines.

The memory operation controller 132 may control the peripheral circuit 120 so that the operating voltage is applied to the selected word line that is coupled to selected memory cells, among the plurality of word lines, during a memory operation.

The memory operation controller 132 may compare the operating voltage with the reference voltage to determine whether the operating voltage is lower than or equal to the reference voltage. The memory operation controller 132 may control the peripheral circuit 120 so that, when the operating voltage is lower than or equal to the reference voltage, the first pass voltage is applied to the unselected word lines, referred to as target word lines, adjacent to the selected word line, while the operating voltage is applied to the selected word line. The memory operation controller 132 may control the peripheral circuit 120 so that the second pass voltage, which has a lower level than the first pass voltage, is applied to the remaining unselected word lines, other than the target word lines, among the unselected word lines, while the operating voltage is applied to the selected word line.

The memory operation controller 132 may control the peripheral circuit 120 so that, when the operating voltage is higher than the reference voltage, the same pass voltage is applied to the unselected word lines while the operating voltage is applied to the selected word line.

In an embodiment, the memory operation controller 132 may update the reference voltage based on the degree of retention degradation of the plurality of memory cells. The memory operation controller 132 may decrease the level of the reference voltage as the degree of retention degradation of the plurality of memory cells increases. The memory operation controller 132 may increase the voltage level difference between the first pass voltage and the second pass voltage as the degree of retention degradation of the plurality of memory cells increases.

In an embodiment, the reference voltage may be a program verify voltage that corresponds to the lowest program state, among the plurality of program states of the selected memory cell. In an embodiment, the reference voltage may be a program verify voltage that corresponds to an intermediate program state, among the plurality of program states of the selected memory cell.

Figure 3:
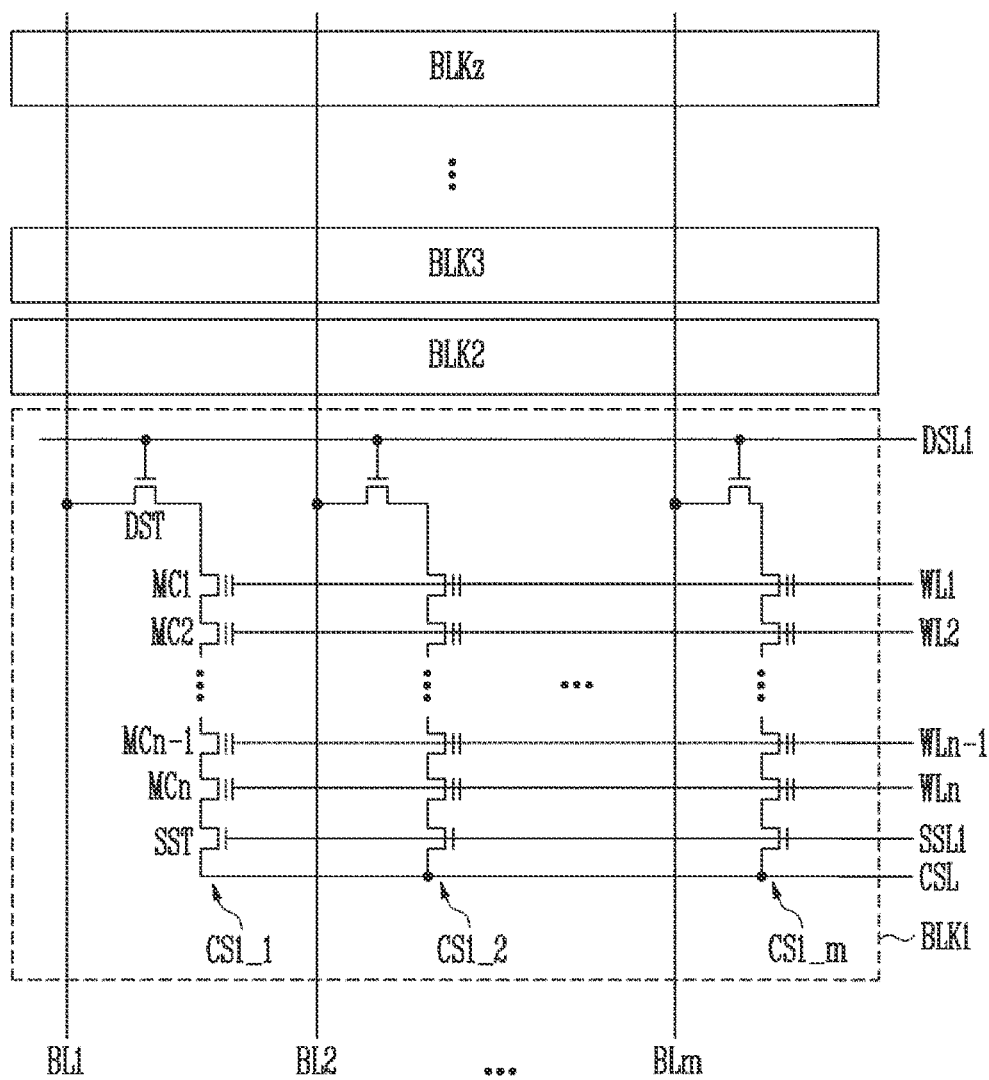
FIG. 3 is a diagram illustrating a memory cell array of FIG. 2.

FIG. 3 is a diagram illustrating the memory cell array of FIG. 2.

Referring to FIG. 3, the first to z-th memory blocks BLK1 to BLKz may be coupled in common to the first to m-th bit lines BL1 to BLm. In FIG. 3, for convenience of description, elements that are included in the first memory block BLK1, among the plurality of memory blocks BLK1 to BLKz, are illustrated, and illustration of elements that are included in each of the remaining memory blocks BLK2 to BLKz is omitted. It will be understood that each of the remaining memory blocks BLK2 to BLKz has the same configuration as the first memory block BLK1.

The memory block BLK1 may include a plurality of cell strings CS1_1 to CS1_m (where m is a positive integer). The first to m-th cell strings CS1_1 to CS1_m may be respectively coupled to the first to m-th bit lines BL1 to BLm. Each of the first to m-th cell strings CS1_1 to CS1_m may include a drain select transistor DST, a plurality of memory cells MC1 to MCn (where n is a positive integer) that are coupled in series to each other, and a source select transistor SST.

A gate terminal of the drain select transistor DST that is included in each of the first to m-th cell strings CS1_1 to CS1_m may be coupled to a first drain select line DSL1. Gate terminals of the first to n-th memory cells MC1 to MCn that are included in each of the first to m-th cell strings CS1_1 to CS1_m may be coupled to first to n-th word lines WL1 to WLn, respectively. A gate terminal of the source select transistor SST that is included in each of the first to m-th cell strings CS1_1 to CS1_m may be coupled to a first source select line SSL1.

For convenience of description, the structure of each cell string will be described based on the first cell string CS1_1, among the plurality of cell strings CS1_1 to CS1_m. However, it will be understood that each of the remaining cell strings CS1_2 to CS1_m is configured in the same manner as the first cell string CS1_1.

A drain terminal of the drain select transistor DST that is included in the first cell string CS1_1 may be coupled to the first bit line BL1. A source terminal of the drain select transistor DST that is included in the first cell string CS1_1 may be coupled to a drain terminal of the first memory cell MC1 included in the first cell string CS1_1. The first to n-th memory cells MC1 to MCn may be coupled in series to each other. A drain terminal of the source select transistor SST that is included in the first cell string CS1_1 may be coupled to a source terminal of the n-th memory cell MCn included in the first cell string CS1_1. A source terminal of the source select transistor SST that is included in the first cell string CS1_1 may be coupled to a common source line CSL. In an embodiment, the common source line CSL may be coupled in common to the first to z-th memory blocks BLK1 to BLKz.

The first drain select line DSL1, the first to n-th word lines WL1 to WLn, and the first source select line SSL1 may be included in the row lines RL of FIG. 2. The first drain select line DSL1, the first to n-th word lines WL1 to WLn, and the first source select line SSL1 may be controlled by the address decoder 121. The common source line CSL may be controlled by the control logic 130. The first to m-th bit lines BL1 to BLm may be controlled by the read and write circuit 123.

Figure 4:
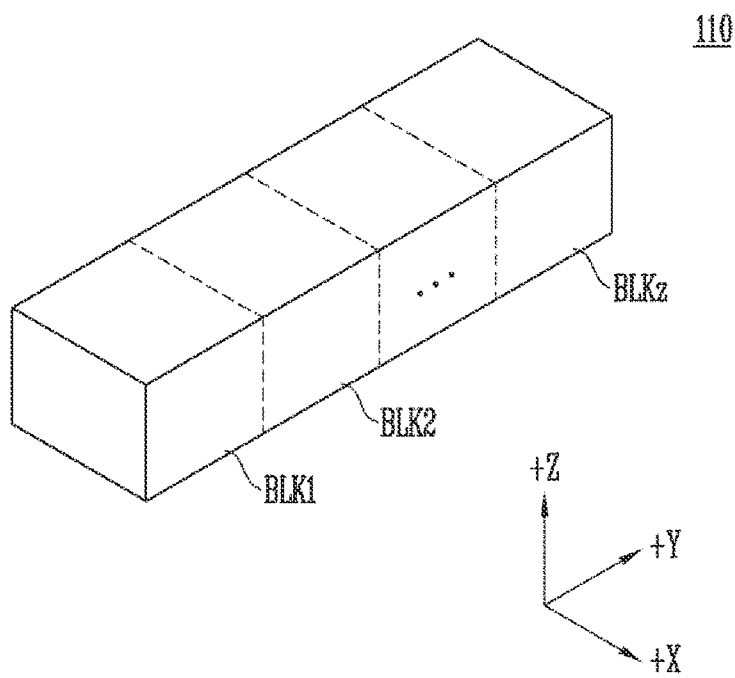
FIG. 4 is a diagram illustrating an embodiment of the memory cell array of FIG. 2.

FIG. 4 is a diagram illustrating an embodiment of the memory cell array of FIG. 2.

Referring to FIG. 4, the memory cell array 110 may include a plurality of memory blocks BLK1 to BLKz. Each memory block may have a three-dimensional (3D) structure. Each memory block may include a plurality of memory cells that are stacked on a substrate. Such memory cells may be arranged in a positive X (+X) direction, a positive Y (+Y) direction, and a positive Z (+Z) direction. The structure of each memory block will be described in detail below with reference to FIGS. 5 and 6.

Figure 5:
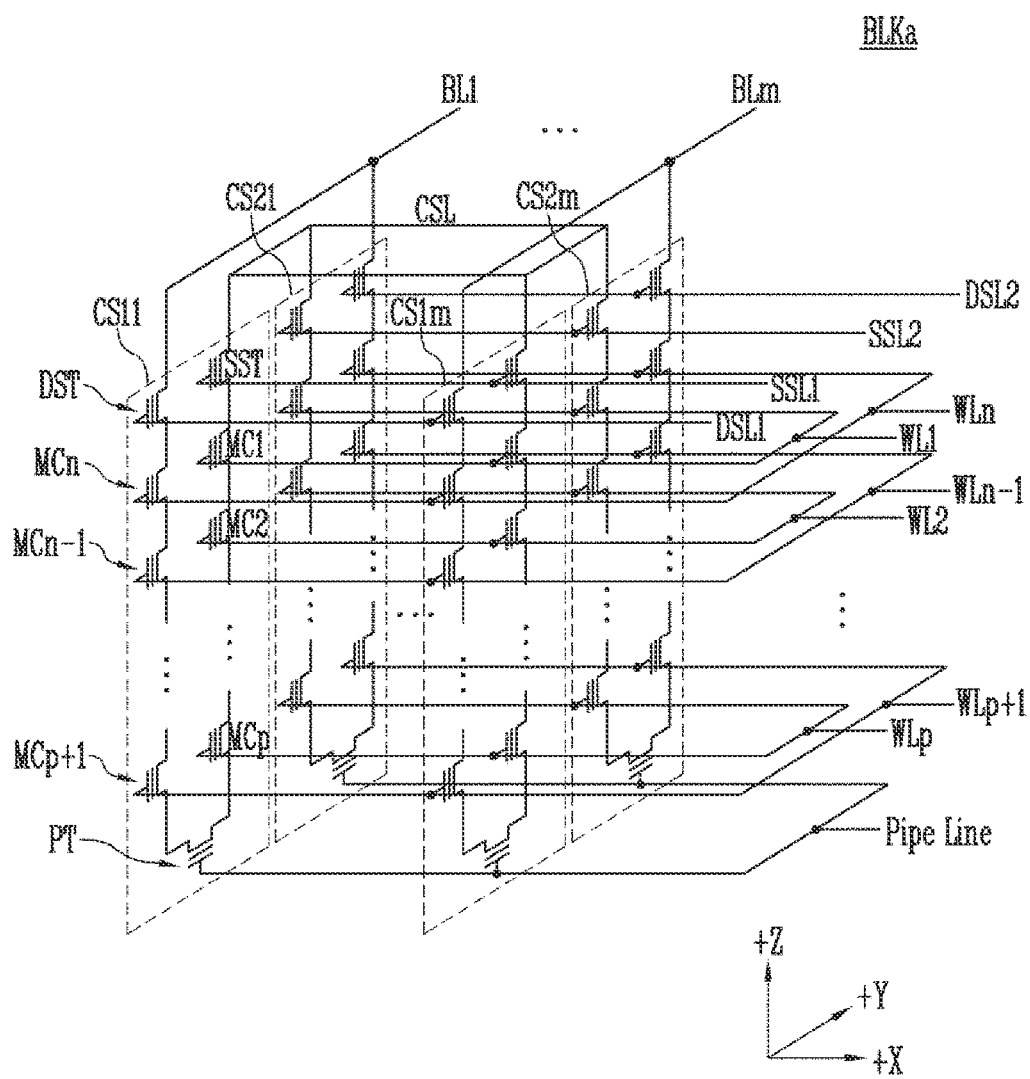
FIG. 5 is a circuit diagram illustrating any one memory block BLKa of memory blocks BLK1 to BLKz of FIG. 4.

FIG. 5 is a circuit diagram illustrating any one memory block BLKa of memory blocks BLK1 to BLKz of FIG. 4.

Referring to FIG. 5, the memory block BLKa may include a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings may be arranged in a row direction (i.e. a positive (+) X direction). In FIG. 5, two cell strings are illustrated as being arranged in a column direction (i.e. a positive (+) Y direction). However, this illustration is made for convenience of description, and it will be understood that three or more cell strings may be arranged in the column direction.

In an embodiment, a single memory block may include a plurality of sub-blocks. A single sub-block may include cell strings that are arranged in a 'U' shape in a single column.

Each of the plurality of cell strings CS11 to CS1m and CS21 to CS2m may include at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string may be coupled between the common source line CSL and memory cells MC1 to MCn.

In an embodiment, the source select transistors of cell strings that are arranged in the same row may be coupled to a source select line that extends in a row direction, and source select transistors of cell strings that are arranged in different rows may be coupled to different source select lines. In FIG. 5, source select transistors of cell strings CS11 to CS1m in a first row may be coupled to a first source select line SSL1. The source select transistors of cell strings CS21 to CS2m in a second row may be coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be sequentially arranged in a direction that is opposite to a positive (+) Z direction and may be coupled in series between the source select transistor SST and the pipe transistor PT. The p+1-th to n-th memory cells MCp+1 to MCn may be sequentially arranged in the +Z direction and may be coupled in series between the pipe transistor PT and the drain select transistor DST. The first to p-th memory cells MC1 to MCp and the p+1-th to n-th memory cells MCp+1 to MCn may be coupled to each other through the pipe transistor PT. The gates of the first to n-th memory cells MC1 to MCn of each cell string may be coupled to first to n-th word lines WL1 to WLn, respectively.

A gate of the pipe transistor PT of each cell string may be coupled to a pipeline PL.

The drain select transistor DST of each cell string may be coupled between the corresponding bit line and the memory cells MCp+1 to MCn. The cell strings in a row direction may be coupled to drain select lines that extend in a row direction. Drain select transistors of cell strings CS11 to CS1m in the first row may be coupled to a first drain select line DSL1. Drain select transistors of cell strings CS21 to CS2m in a second row may be coupled to a second drain select line DSL2.

Cell strings that are arranged in a column direction may be coupled to bit lines extending in a column direction. In FIG. 5, cell strings CS11 and CS21 in a first column may be coupled to a first bit line BL1. Cell strings CS1m and CS2m in an m-th column may be coupled to an m-th bit line BLm.

Memory cells that are coupled to the same word line in cell strings that are arranged in the row direction may form a single page. For example, memory cells that are coupled to the first word line WL1, among the cell strings CS11 to CS1m in the first row, may form a single page. Memory cells that are coupled to the first word line WL1, among the cell strings CS21 to CS2m in the second row, may form an additional page. Cell strings that are arranged in the direction of a single row may be selected by selecting any one of the drain select lines DSL1 and DSL2. A single page may be selected from the selected cell strings by selecting any one of the word lines WL1 to WLn.

In an embodiment, instead of the first to m-th bit lines BL1 to BLm, even bit lines and odd bit lines may be provided. Further, even-numbered cell strings, among the cell strings CS11 to CS1m or CS21 to CS2m that are arranged in the row direction, may be coupled to respective even bit lines. Odd-numbered cell strings, among the cell strings CS11 to CS1m or CS21 to CS2m that are arranged in the row direction, may be coupled to respective odd bit lines.

In an embodiment, one or more of the first to n-th memory cells MC1 to MCn may be used as dummy memory cells. For example, one or more dummy memory cells may be provided to reduce an electric field between the source select transistor SST and the memory cells MC1 to MCp. Alternatively, the one or more dummy memory cells may be provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may deteriorate further.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells may control the voltages that are applied to the dummy word lines that are coupled to respective dummy memory cells, and thus, the dummy memory cells may have required threshold voltages.

Figure 6:
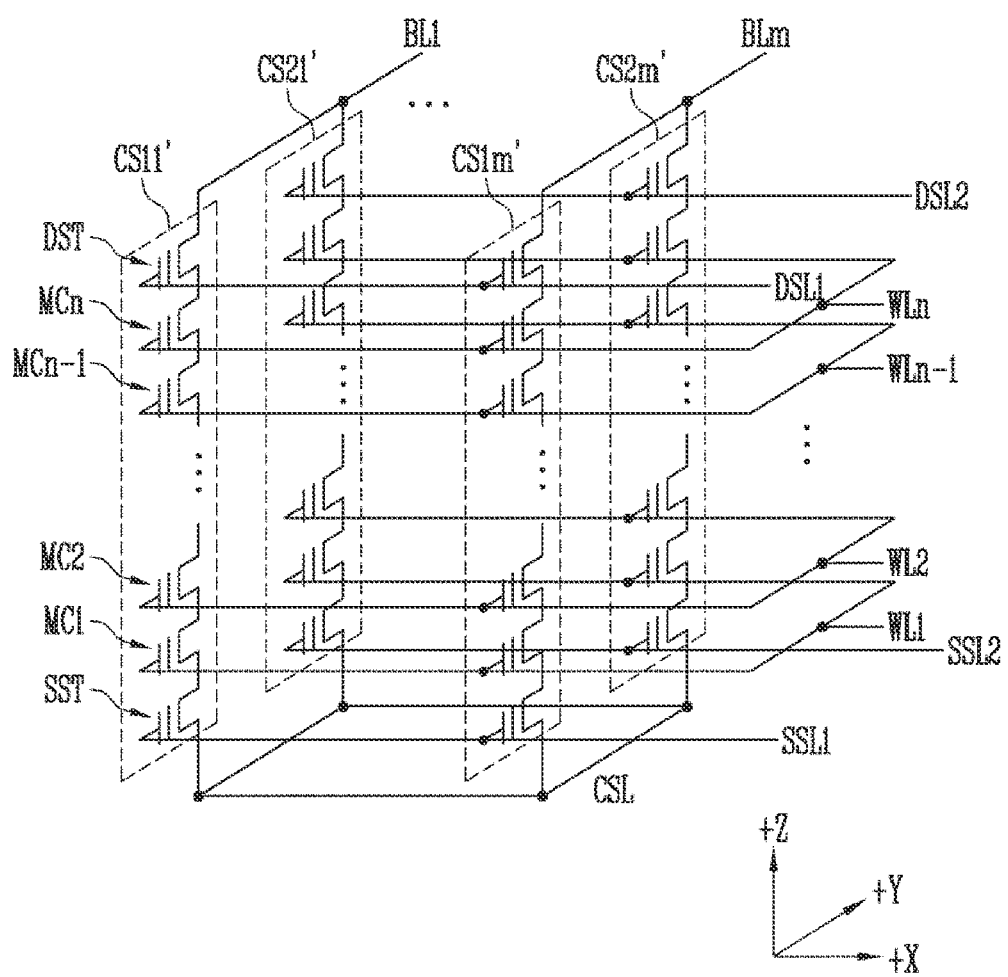
FIG. 6 is a circuit diagram illustrating an example of any one memory block BLKb of the memory blocks BLK1 to BLKz of FIG. 4.

FIG. 6 is a circuit diagram illustrating an example of any one memory block BLKb of the memory blocks BLK1 to BLKz of FIG. 4.

Referring to FIG. 6, the memory block BLKb may include a plurality of cell strings CS11' to CS1m' and CS21' to CS2m'. Each of the cell strings CS11' to CS1m' and CS21' to CS2m' may extend in a positive (+) Z direction. Each of the cell strings CS11' to CS1m' and CS21' to CS2m' may include at least one source select transistor SST, first to n-th memory cells MC1 to MCn, and at least one drain select transistor DST, which are stacked on a substrate (not illustrated) below the memory block BLKb.

In an embodiment, a single memory block may include a plurality of sub-blocks. A single sub-block may include cell strings that are arranged in an 'I' shape in a single column.

The source select transistor SST of each cell string may be coupled between a common source line CSL and memory cells MC1 to MCn. The source select transistors of cell strings that are arranged in the same row may be coupled to the same source select line. Source select transistors of cell strings CS11' to CS1m' that are arranged in a first row may be coupled to a first source select line SSL1. Source select transistors of cell strings CS21' to CS2m' that are arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string may be coupled in series between the source select transistor SST and the drain select transistor DST. The gates of the first to n-th memory cells MC1 to MCn may be coupled to first to n-th word lines WL1 to WLn, respectively.

The drain select transistor DST of each cell string may be coupled between the corresponding bit line and the memory cells MC1 to MCn. Drain select transistors of cell strings that are arranged in a row direction may be coupled to drain select lines extending in a row direction. The drain select transistors of the cell strings CS11' to CS1m' in the first row may be coupled to a first drain select line DSL1. The drain select transistors of the cell strings CS21' to CS2m' in the second row may be coupled to a second drain select line DSL2.

As a result, the memory block BLKb of FIG. 6 has an equivalent circuit that is similar to that of the memory block BLKa of FIG. 5 except that a pipe transistor PT is excluded from each cell string.

In an embodiment, instead of the first to m-th bit lines BL1 to BLm, even bit lines and odd bit lines may be provided. Further, even-numbered cell strings, among the cell strings CS11' to CS1m' or CS21' to CS2m' that are arranged in the row direction, may be coupled to respective even bit lines. Odd-numbered cell strings, among the cell strings CS11' to CS1m' or CS21' to CS2m' that are arranged in the row direction, may be coupled to respective odd bit lines.

In an embodiment, one or more of the first to n-th memory cells MC1 to MCn may be used as dummy memory cells. For example, the one or more dummy memory cells may be provided to reduce an electric field between the source select transistor SST and the memory cells MC1 to MCn. Alternatively, the one or more dummy memory cells may be provided to reduce an electric field between the drain select transistor DST and the memory cells MC1 to MCn. As the number of dummy memory cells that are provided increases, the reliability of operation of the memory block BLKb may be improved, whereas the size of the memory block BLKb may increase. As the number of dummy memory cells that are provided decreases, the size of the memory block BLKb may decrease, whereas the reliability of operation of the memory block BLKb may deteriorate further.

In order to efficiently control the one or more dummy memory cells, respective dummy memory cells may require threshold voltages. Before or after an erase operation on the memory block BLKb is performed, program operations may be performed on all or some of the dummy memory cells. When the erase operation is performed after the program operations have been performed, the dummy memory cells may receive the required threshold voltages by controlling the voltages to be applied to dummy word lines that are coupled to respective dummy memory cells.

Figure 7:
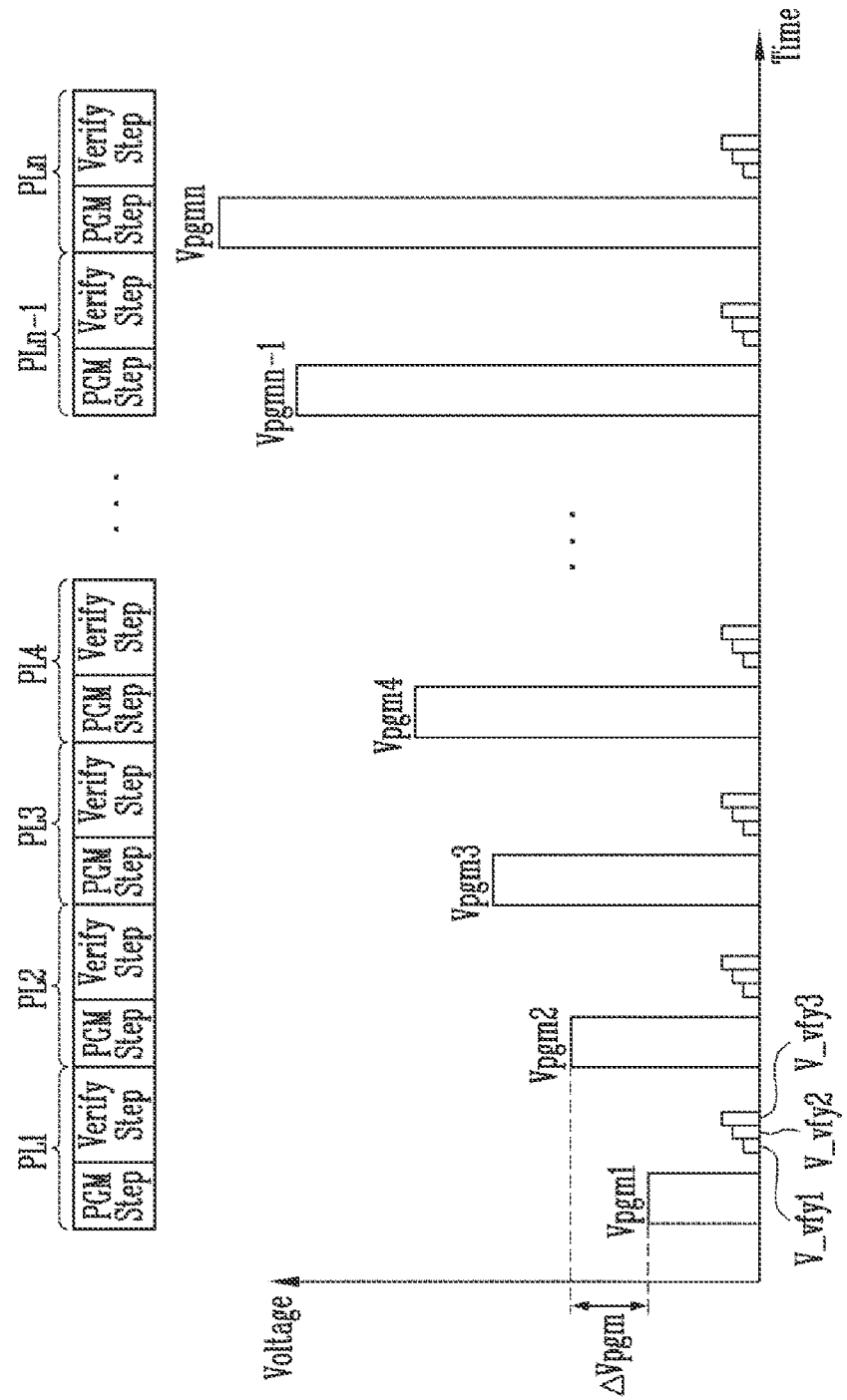
FIG. 7 is a diagram illustrating incremental step pulse programming (ISPP).

FIG. 7 is a diagram illustrating incremental step pulse programming (ISPP).

In FIG. 7, for convenience of description, a memory cell is assumed to be a multi-level cell (MLC) that stores 2-bit data. However, the scope of the present disclosure is not limited thereto, and the memory cell may be a triple-level cell (TLC) that stores 3-bit data or a quad-level cell (QLC) that stores 4-bit data. The number of data bits stored in each memory cell may be one or more.

The memory device may perform a program operation so that each of selected memory cells has a threshold voltage that corresponds to any one of a plurality of program states PV1, PV2, and PV3 by performing a plurality of program loops PL1 to PLn.

Each of the program loops PL1 to PLn may include a program voltage apply step (PGM Step) that applies a program voltage to a selected word line that is coupled to the selected memory cells and a program verify step (Verify Step) that determines whether the memory cells have been programmed by applying verify voltages.

For example, when the first program loop PL1 is performed, a first program voltage Vpgm1 may be applied, and thereafter first to third verify voltages V_vfy1 to V_vfy3 may be sequentially applied so as to verify the program states of the selected memory cells. Here, memory cells, the target program state of which is the first program state P1, may be verified by using the first verify voltage V_vfy1, memory cells, the target program state of which is the second program state P2, may be verified by using the second verify voltage V_vfy2, and memory cells, the target program state of which is the third program state P3, may be verified by using the third verify voltage V_vfy3.

The memory cells that have passed verification (i.e., verify-passed) through respective verify voltages V_vfy1 to V_vfy3 may be determined to have the target program states and may then be program-inhibited in the second program loop PL2. In other words, a program-inhibition voltage may be applied to bit lines that are coupled to memory cells with passed verification from the second program loop PL2.

In order to program memory cells other than the program-inhibited memory cells in the second program loop PL2, a second program voltage Vpgm2 that is higher than the first program voltage Vpgm1 by a unit voltage (step voltage) ΔVpgm may be applied to a selected word line. Thereafter, a verify operation may be performed in the same way as the verify operation in the first program loop PL1. In an example, the term "verify-passed" may indicate that a memory cell is read as an off-cell through the corresponding verify voltage.

As described above, when the memory device programs multi-level cells (MLC) which store 2 data bits, the memory device may individually verify the memory cells with respective program states as target program states by using the first to third verify voltages V_vfy1 to V_vfy3.

During the verify operation, the corresponding verify voltage may be applied to the selected word line, which is a word line that is coupled to selected memory cells, and the page buffer of FIG. 2 may determine whether the selected memory cells have passed verification based on currents that flow through bit lines that are respectively coupled to the selected memory cells or voltages that are applied to the bit lines.

In the case of incremental step pulse programming, a program verify operation may be performed in each program loop, and thus, the threshold voltage distributions of memory cells may be formed with higher accuracy. The time point at which a program-inhibition voltage is to be applied to the bit lines that are coupled to memory cells may be determined based on the result of the program verify operation.

Figure 8:
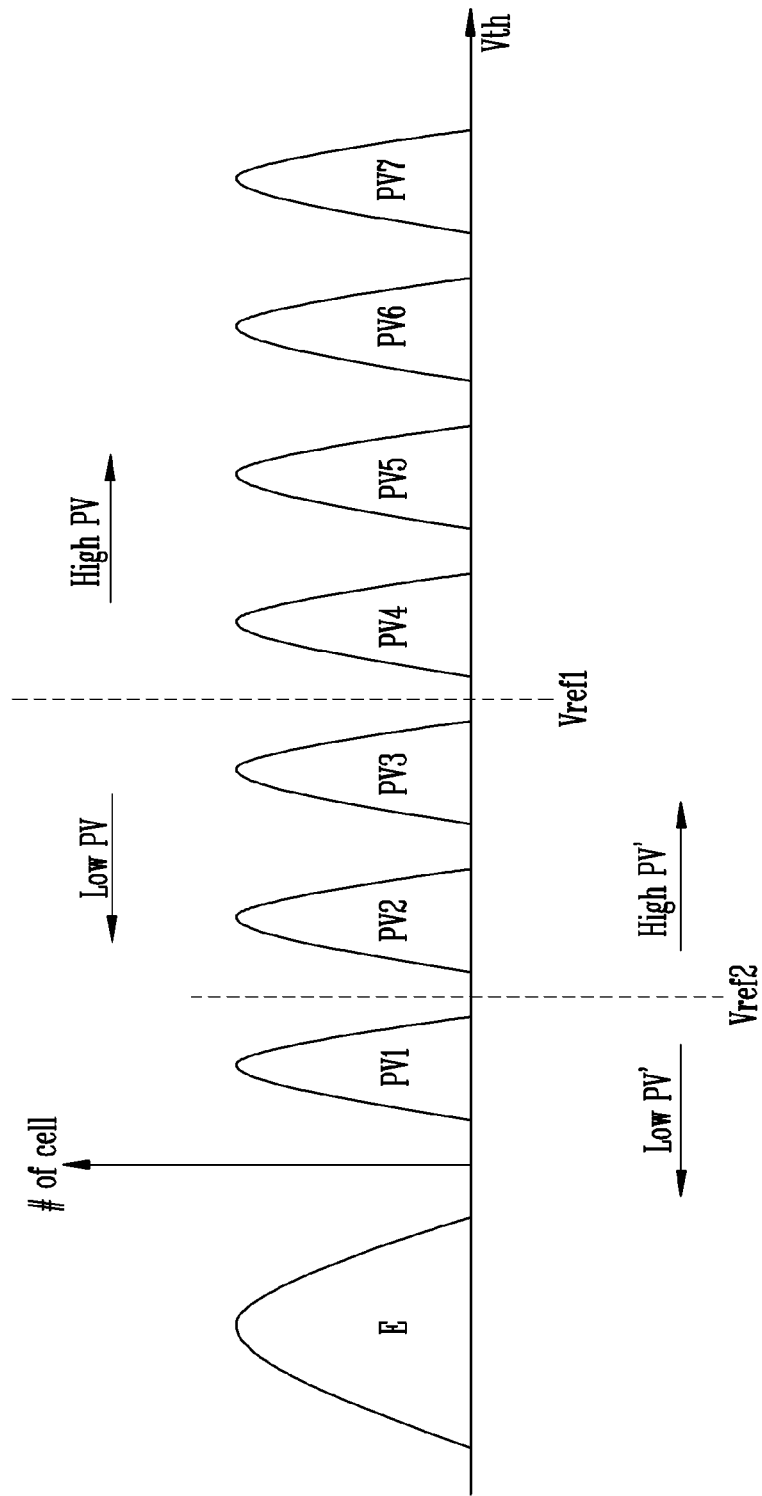
FIG. 8 is a diagram illustrating a plurality of program states classified according to a reference voltage.

FIG. 8 is a diagram illustrating a plurality of program states classified according to a reference voltage.

Referring to FIG. 8, memory cells may be triple-level cells, each of which stores three data bits. However, the number of data bits stored in one memory cell is not limited to that of the present embodiment.

Each of a plurality of memory cells may be programmed to any one of a plurality of program states.

For example, the memory cells may be programmed to any one of first to seventh program states P1 to P7 based on threshold voltages (Vth).

The plurality of program states to which the memory cells are programmed may be classified into a low program state and a high program state according to the reference voltage.

For example, first to third program states P1 to P3, in which threshold voltage distributions are located on the left of a first reference voltage Vref1, may be set to the low program state Low PV. Fourth to seventh program states P4 to P7, in which threshold voltage distributions are located on the right side of the first reference voltage Vref1, may be set to the high program state High PV.

In an embodiment, the operating voltage that is required to read the first to third program states P1 to P3 or verify the program states may be lower than or equal to the first reference voltage Vref1. The operating voltage that is required to read the fourth to seventh program states P4 to P7 or verify the program states may be higher than the first reference voltage Vref1.

In an embodiment, the maximum value for the reference voltage may be a program verify voltage that corresponds to an intermediate program state, among the plurality of program states. The minimum value for the reference voltage may be a program verify voltage that corresponds to the lowest program state, among the plurality of program states. An initial value for the reference voltage may be set between the program verify voltage that corresponds to the lowest program state and the program verify voltage that corresponds to the intermediate program state.

The reference voltage may be updated and changed based on the degree of retention degradation of memory cells. For example, as the degree of retention degradation of memory cells increases, the reference voltage may be changed from the first reference voltage Vref1 to a second reference voltage Vref2.

In this case, the first program state P1, in which threshold voltage distributions are located on the left side of the second reference voltage Vref2, may be set to a low program state Low PV'. The second to seventh program states P2 to P7, in which threshold voltage distributions are located on the right side of the second reference voltage Vref2, may be set to a high program state High PV'.

In an embodiment, the operating voltage that is required to read the first program state P1 or verify the program state may be lower than or equal to the second reference voltage Vref2. The operating voltage that is required to read the second to seventh program states P2 to P7 or verify the program states may be higher than the second reference voltage Vref2.

Figure 9:
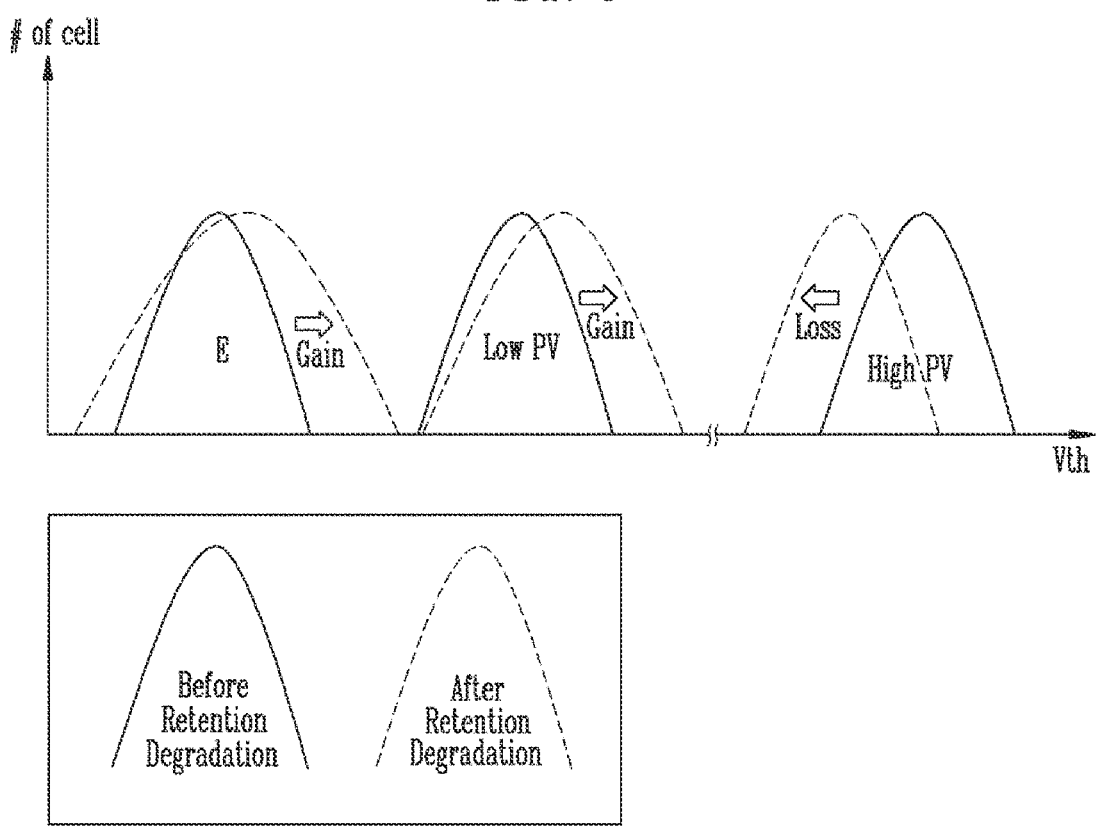
FIG. 9 is a diagram illustrating threshold voltage distributions based on the degree of retention degradation of memory cells.

FIG. 9 is a diagram illustrating threshold voltage distributions based on the degree of retention degradation of memory cells.

Referring to FIG. 9, with the lapse of time after programming of the plurality of memory cells, retention characteristics in which memory cells retain trapped electrons may be degraded.

The degradation of retention characteristics of memory cells may appear differently in a high program state High PV compared to a low program state Low PV.

Gain characteristics of the memory cells that are programmed to the low program state Low PV may be dominant, and threshold voltage distributions thereof may be entirely shifted to the right. Loss characteristics of the memory cells that are programmed to the high program state High PV may be dominant, and threshold voltage distributions thereof may be entirely shifted to the left.

Due to retention degradation of memory cells, an interval between the threshold voltage distributions of memory cells that are programmed to an erased state E and the low program state Low PV may be decreased. That is, a read margin may be decreased.

Figure 10:
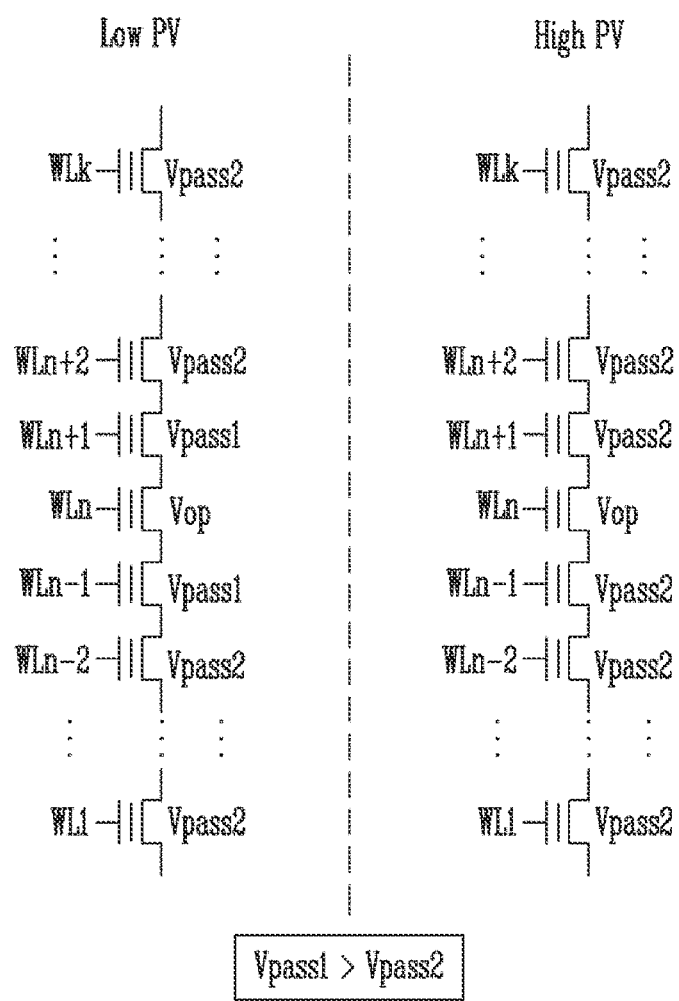
FIG. 10 is a diagram illustrating voltages that are applied to a plurality of word lines during a memory operation according to an embodiment.

FIG. 10 is a diagram illustrating voltages that are applied to a plurality of word lines during a memory operation according to an embodiment.

Referring to FIG. 10, the plurality of word lines may include first to k-th word lines WL1 to WLk (where k is a natural number of 1 or more). In FIG. 10, a selected word line may be an n-th word line WLn (where n is a natural number of 1 or more). Among the unselected word lines, target word lines that are adjacent to the selected word line may be an n−1-th word line Wn−1 and an n+1-th word line Wn+1. Among the unselected word lines, the remaining unselected word lines, other than the target word lines, may be first to n−2-th word lines WL1 to WLn−2 and n+2-th to k-th word lines WLn+2 to WLk.

A memory operation may be performed on memory cells that are coupled to the selected word line, among a plurality of memory cells that are coupled to the plurality of word lines. The memory operation may be a read operation or a program verify operation.

In an embodiment, different pass voltages may be applied to the target word lines and the remaining unselected word lines based on whether the corresponding memory operation is a memory operation that corresponds to the low program state Low PV or the high program state High PV.

In the case of a memory operation that corresponds to the low program state Low PV, an operating voltage Vop may be applied to the selected word line. The first pass voltage Vpass1 may be applied to the target word lines. A second pass voltage Vpass2, having a lower level than the first pass voltage Vpass1, may be applied to the remaining unselected word lines.

In the case of a memory operation that corresponds to the high program state High PV, the operating voltage Vop may be applied to the selected word line. The same second pass voltage Vpass2 may be applied to all of unselected word lines.

Figure 11:
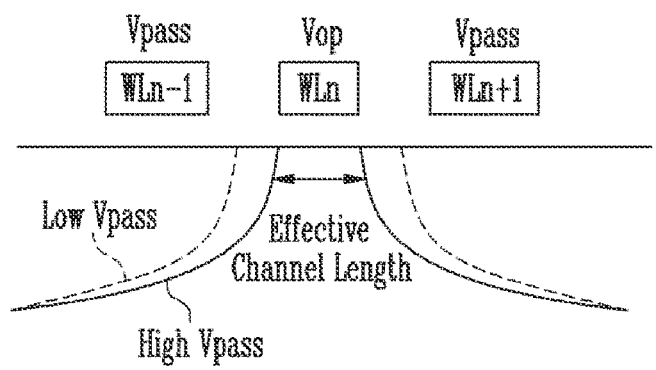
FIG. 11 is a diagram illustrating an effective channel length, which varies with the magnitude of a pass voltage that is applied to target word lines that are adjacent to a selected word line.

FIG. 11 is a diagram illustrating an effective channel length, which varies with the magnitude of a pass voltage that is applied to target word lines that are adjacent to a selected word line.

Referring to FIG. 11, an operating voltage Vop may be applied to a selected word line WLn. The pass voltage Vpass may be applied to target word lines WLn−1 and WLn+1 that are adjacent to the selected word line.

The length of an effective channel in the case of applying a high pass voltage to the target word lines may be shorter than in the case of applying a low pass voltage to the target word lines. Since movement of charges is facilitated as the length of the effective channel is shorter, an effect of decreasing the threshold voltages of memory cells is obtained.

Figure 12:
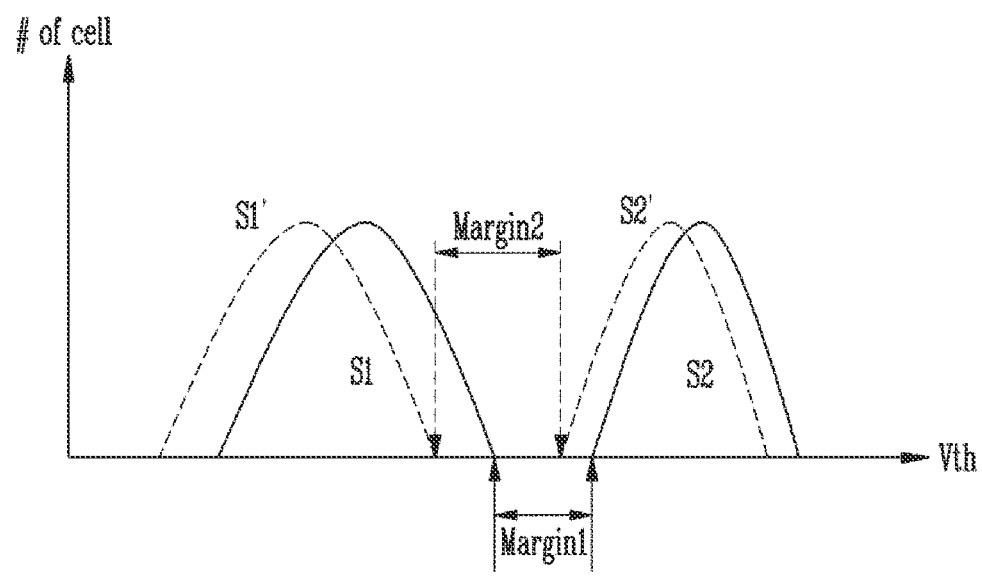
FIG. 12 is a diagram illustrating the difference between margins of adjacent threshold voltage distributions based on an effective channel length.

FIG. 12 is a diagram illustrating the difference between margins of adjacent threshold voltage distributions based on an effective channel length.

Referring to FIG. 12, memory cells may have threshold voltage distributions that respectively correspond to a plurality of states S1 and S2 due to retention degradation. The interval between a threshold voltage distribution that corresponds to the state S1 and a threshold voltage distribution that corresponds to the state S2 may be a margin Margin1.

As described above with reference to FIG. 11, when a pass voltage higher than a pass voltage that is applied to the remaining unselected word lines is applied to word lines that are adjacent to the selected word line to which the operating voltage is applied, the length of the effective channel may be shortened. When the length of the effective channel is shortened, an effect of reading the memory cells in the state in which the threshold voltage distributions of the memory cells are decreased may occur. In other words, when the same operating voltage is applied to the selected word line, a memory operation may be performed by using a margin Margin2 between the threshold voltage distributions that correspond to states S1' and S2', other than the states S1 and S2. That is, because the interval between threshold voltage distributions is increased, a decrease in margin attributable to the degree of retention degradation of memory cells may be alleviated.

Figure 13A:
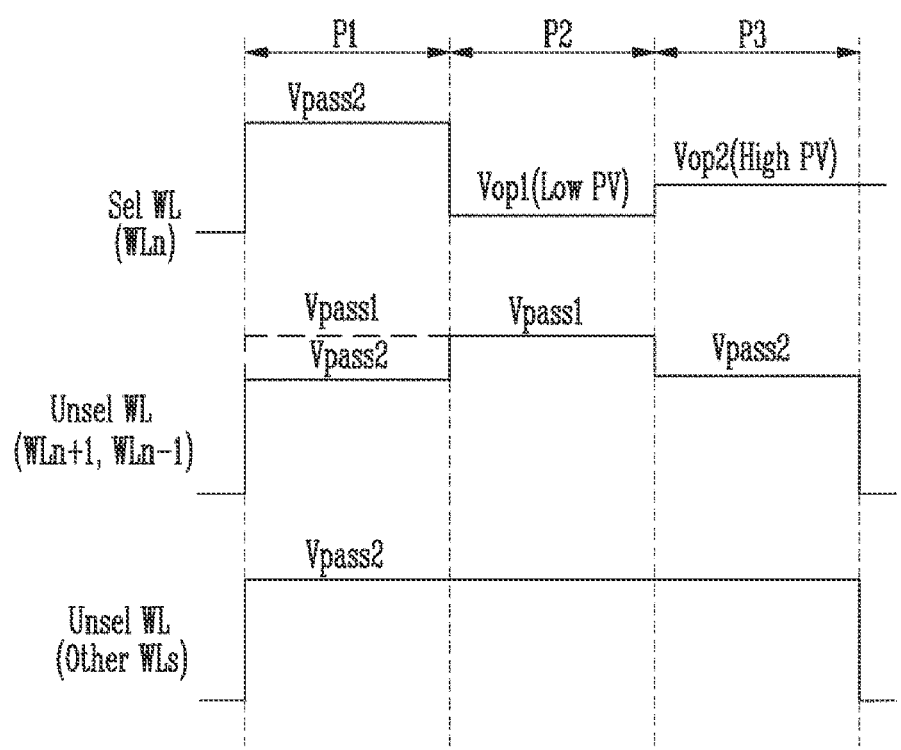
FIG. 13A is a timing diagram illustrating the operation of a memory device according to an embodiment.

FIG. 13A is a timing diagram illustrating the operation of a memory device according to an embodiment.

Referring to FIG. 13A, a plurality of word lines may include a selected word line and unselected word lines.

During a period P1, the same second pass voltage Vpass2 may be applied to the selected word line WLn, target word lines WLn−1 and WLn+1 that are adjacent to the selected word line, and the remaining unselected word lines (i.e., other WLs). The reason for applying the same pass voltage to all word lines is to minimize disturbance attributable to the voltage level difference between pass voltages for the respective word lines. In other embodiments, a first pass voltage Vpass1 to be applied during a period P2 may be applied to the target word lines.

During the second period P2, a memory operation may be performed. A program state in which the memory operation is performed may be a program state Low PV in which a program verify voltage is lower than a reference voltage. In other words, a first operating voltage Vop1, having a lower level than or equal to the reference voltage, may be applied to the selected word line during the memory operation. While the first operating voltage Vop1 is applied to the selected word line, the first pass voltage Vpass1 may be applied to target word lines. The second pass voltage Vpass2, which has a lower voltage than the first pass voltage Vpass1, may be applied to the remaining unselected word lines, among the unselected word lines.

During a period P3, a memory operation may be performed. A program state in which the memory operation is performed may be a program state High PV in which the program verify voltage is higher than the reference voltage. In other words, a second operating voltage Vop2 with a higher level than the reference voltage may be applied to the selected word line during the memory operation. While the second operating voltage Vop2 is applied to the selected word line, the same second pass voltage Vpass2 may be applied to the unselected word lines.

Referring back to FIG. 9, in the case of the low program state Low PV, gain characteristics may be dominant, and thus, threshold voltage distributions of memory cells may be shifted to the right as retention degradation of the memory cells progresses. Therefore, as described above with reference to FIGS. 11 and 12, the memory device may apply a pass voltage that is higher than that applied to the remaining unselected word lines to target word lines that are adjacent to the selected word line during a memory operation, thereby shortening the length of the effective channel and increasing the margin between threshold voltage distributions, and thus, a decrease in margin attributable to retention degradation may be alleviated.

In the case of the high program state High PV, loss characteristics are dominant, and thus, threshold voltage distributions thereof may be entirely shifted to the left as retention degradation of the memory cells progresses. Therefore, because the case of the high program state may be opposite the case of the low program state Low PV, the same pass voltage is applied to the target word lines that are adjacent to the selected word line and the remaining unselected word lines, and thus, a decrease in margin attributable to retention degradation may be alleviated.

In FIG. 13A, the memory operation may be performed in the direction in which the operating voltage increases in a forward sequence. Therefore, when the memory operation progresses from the period P2 to the period P3, the operating voltage that is applied to the selected word line may be increased from the first operating voltage Vop1 to the second operating voltage Vop2.

FIG. 13B is a timing diagram illustrating the operation of a memory device according to an embodiment.

Referring to FIG. 13B, a period P1' may be identical to the period P1 described above with reference to FIG. 13A. A period P2' may be identical to the period P3. A period P3' may be identical to the period P2.

In FIG. 13B, the memory operation may be performed in the direction in which the operating voltage decreases in a reverse sequence. Therefore, when the memory operation progresses from the period P2' to the period P3', the operating voltage that is applied to the selected word line may be decreased from the second operating voltage Vop2 to the first operating voltage Vop1.

Figure 14:
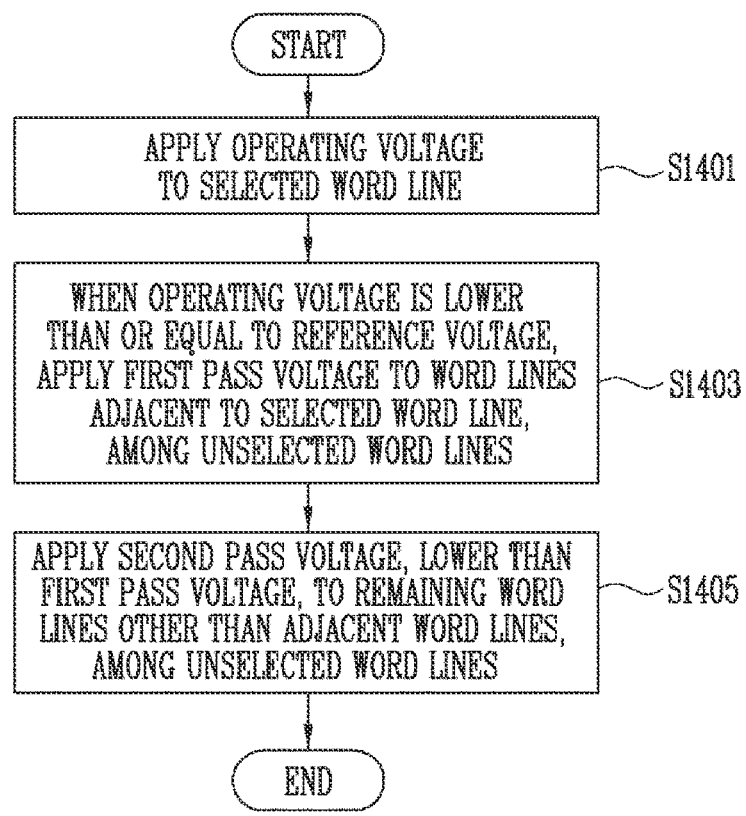
FIG. 14 is a flowchart illustrating the operation of a memory device according to an embodiment.

FIG. 14 is a flowchart illustrating the operation of a memory device according to an embodiment.

Referring to FIG. 14, at step S1401, a memory device may apply an operating voltage to a selected word line. The operating voltage may be a read voltage or a program verify voltage.

At step S1403, when the operating voltage is lower than or equal to a reference voltage, the memory device may apply a first pass voltage to word lines that are adjacent to the selected word line, among unselected word lines.

At step S1405, the memory device may apply a second pass voltage, having a lower level than the first pass voltage, to the remaining unselected word lines, other than the word lines that are adjacent to the selected word line, among the unselected word lines.

FIG. 15 is a flowchart illustrating the operation of a memory device according to an embodiment.

Referring to FIG. 15, at step S1501, a memory device may apply an operating voltage to a selected word line. The operating voltage may be a read voltage or a program verify voltage.

At step S1503, the memory device may determine whether the operating voltage is lower than or equal to a reference voltage. When it is determined that the operating voltage is lower than or equal to the reference voltage, the process proceeds to step S1505, whereas when it is determined that the operating voltage is higher than the reference voltage, the process proceeds to step S1509.

At step S1505, the memory device may apply a first pass voltage to word lines that are adjacent to the selected word line, among unselected word lines.

At step S1507, the memory device may apply a second pass voltage, having a lower level than the first pass voltage, to the remaining unselected word lines, other than the word lines that are adjacent to the selected word line, among the unselected word lines.

At step S1509, the memory device may apply the second pass voltage with the same level to the unselected word lines, among the plurality of word lines.

In accordance with the present disclosure, there are provided a memory device in which a read margin between threshold voltage distributions that correspond to respective program states is improved, and a method of operating the memory device.

What is claimed is:

1. A memory device, comprising:
a plurality of memory cells coupled to a plurality of word lines;
a peripheral circuit configured to perform a memory operation on memory cells that are selected from among the plurality of memory cells; and
a control logic configured to control the peripheral circuit, during the memory operation, to apply:
an operating voltage to a selected word line, among the plurality of word lines, coupled to the selected memory cells,
a first pass voltage to target word lines adjacent to the selected word line among unselected word lines, based on whether the operating voltage is lower than or equal to a reference voltage, and
a second pass voltage, having a lower level than the first pass voltage, to remaining unselected word lines, other than the target word lines among the unselected word lines,
wherein the control logic controls the peripheral circuit to apply the second pass voltage to all of the unselected word lines during the memory operation when the operating voltage is higher than the reference voltage.

2. The memory device according to claim 1, wherein the control logic comprises:
a memory operation table storage configured to store information regarding the operating voltage that is used in the memory operation and information regarding a plurality of pass voltages; and
a memory operation controller configured to control the peripheral circuit, when the operating voltage is lower than or equal to the reference voltage, to apply the first pass voltage to the target word lines and the second pass voltage to the remaining unselected word lines.

3. The memory device according to claim 2,
wherein the memory operation controller is configured to update the reference voltage based on a degree of retention degradation of the plurality of memory cells.

4. The memory device according to claim 3,
wherein the memory operation controller decreases a level of the reference voltage as the degree of retention degradation of the plurality of memory cells increases.

5. The memory device according to claim 2,
wherein the memory operation controller increases a voltage level difference between the first pass voltage and the second pass voltage as a degree of retention degradation of the plurality of memory cells increases.

6. The memory device according to claim 1,
wherein the reference voltage is a program verify voltage that corresponds to a lowest program state, among a plurality of program states of the selected memory cells.

7. The memory device according to claim 1,
wherein the reference voltage is a program verify voltage that corresponds to an intermediate program state, among a plurality of program states of the selected memory cells.

8. The memory device according to claim 1,
wherein the memory operation is a read operation or a program verify operation.

9. A method of operating a memory device, the memory device with a plurality of memory cells that are coupled to a plurality of word lines, the method comprising:
applying an operating voltage to a selected word line coupled to memory cells that are selected from among the plurality of memory cells;
determining whether the operating voltage is lower than or equal to a reference voltage;
when the operating voltage is lower than or equal to the reference voltage, applying a first pass voltage to target word lines adjacent to the selected word line among unselected word lines, and a second pass voltage, having a lower level than the first pass voltage, to remaining unselected word lines, other than the target word lines, among the unselected word lines; and
when the operating voltage is higher than the reference voltage, applying the second pass voltage to all of the unselected word lines, among the plurality of word lines.

10. The method according to claim 9,
wherein the operating voltage is a read voltage or a program verify voltage.

11. The method according to claim 9, wherein applying the operating voltage to the selected word line comprises:
applying the operating voltage to the selected word line in a direction in which the operating voltage increases.

12. The method according to claim 9, wherein applying the operating voltage to the selected word line comprises:
applying the operating voltage to the selected word line in a direction in which the operating voltage decreases.

13. The method according to claim 9,
wherein the reference voltage is a program verify voltage that corresponds to a lowest program state, among a plurality of program states of the selected memory cells.

14. The method according to claim 9, wherein the reference voltage is a program verify voltage that corresponds to an intermediate program state, among a plurality of program states of the selected memory cells.

15. The method according to claim 9, further comprising:
updating the reference voltage based on a degree of retention degradation of the plurality of memory cells.

16. The method according to claim 15, wherein updating the reference voltage comprises:
decreasing a level of the reference voltage as the degree of retention degradation of the plurality of memory cells increases.

17. The method according to claim 9,
wherein a voltage level difference between the first pass voltage and the second pass voltage increases as a degree of retention degradation of the plurality of memory cells increases.

* * * * *